United States Patent [19]

Takaya et al.

[11] Patent Number: 4,879,193

[45] Date of Patent: Nov. 7, 1989

[54] LIGHT SENSITIVE MATERIAL FOR MAKING LITHOGRAPHIC PRINTING PLATE THEREFROM

[75] Inventors: Yoshikazu Takaya; Kazuo Yokoyama, both of Nagaokakyo, Japan

[73] Assignee: Mitsubishi Paper Mills, Ltd., Tokyo, Japan

[21] Appl. No.: 168,906

[22] Filed: Mar. 16, 1988

[30] Foreign Application Priority Data

Mar. 17, 1987 [JP] Japan .................................. 62-63472

[51] Int. Cl.$^4$ ........................... G03C 5/54; G03C 1/80
[52] U.S. Cl. ..................................... 430/14; 430/204; 430/227; 430/229; 430/533; 430/534; 430/954; 101/463.1; 101/468
[58] Field of Search ............... 430/204, 229, 533, 534, 430/954, 227, 14; 101/463.1, 468

[56] References Cited

U.S. PATENT DOCUMENTS

| | | | |
|---|---|---|---|
| 1,215,234 | 2/1917 | Amsden . | |
| 2,830,030 | 4/1958 | Fuchs | 260/32.4 |
| 2,943,937 | 7/1960 | Nadeau et al. | 96/87 |
| 3,475,193 | 9/1965 | Takenaka et al. | 117/34 |
| 3,728,114 | 4/1973 | Futaki et al. | 430/204 |
| 4,093,458 | 6/1978 | McGrail et al. | 96/87 R |
| 4,128,426 | 12/1978 | Ohta et al. | 427/407 R |
| 4,160,670 | 7/1979 | Tsubai et al. | 430/204 |
| 4,230,792 | 10/1980 | Tsubai et al. | 430/302 |
| 4,241,169 | 12/1980 | Work III et al. | 430/532 |
| 4,265,946 | 5/1981 | Yabe et al. | 430/533 |
| 4,297,429 | 10/1981 | Kanada et al. | 430/204 |
| 4,357,407 | 11/1982 | Vermeulen et al. | 430/204 |
| 4,394,442 | 7/1983 | Miller | 430/532 |

Primary Examiner—Richard L. Schilling
Attorney, Agent, or Firm—Cushman, Darby & Cushman

[57] ABSTRACT

Disclosed are a light sensitive material and a lithographic printing plate made therefrom by silver complex diffusion transfer process ree from peeling of layer during printing which comprises a polyester film support made hydrophilic by coating with an organic copolymer as a support and at least one undercoat layer, a silver halide emulsion layer and an image receiving layer containing physical development nuclei layer provided on said support in succession, said undercoat layer contiguous to the support containing a polyfunctional epoxy compound having at least three epoxy groups in molecule.

6 Claims, No Drawings

LIGHT SENSITIVE MATERIAL FOR MAKING LITHOGRAPHIC PRINTING PLATE THEREFROM

BACKGROUND OF THE INVENTION

The present invention relates to a light sensitive material for making a lithographic printing plate therefrom using silver complex diffusion transfer process (DTR process) and especially to a light sensitive material for lithographic printing plate having as a support a polyester film coated with an organic copolymer composition for rendering it hydrophilic and increasing adhesion thereof.

A method for making a lithographic printing plate using DTR process, more particularly, a method comprising imagewise exposing a light sensitive material comprising a support, at least one light sensitive layer provided thereon and a physical development nuclei layer to which the image recorded on the light sensitive layer is reverse-transferred and which is provided on said light sensitive layer and then subjecting the exposed material to silver diffusion transfer development to form a metallic silver image on the outer surface of the material is called "direct plate making method". This method is more advantageous in simplicity and rapidity than conventional methods which use a lith film as an intermediate process while it has the problem in printability that only less prints can be obtained and various improvements have been made therefor.

The same can be applied to the lithographic printing plates basically disclosed in U.S. Pat. No. No. 3,728,114 and this has been considerably improved in printability by the lithographic printing plate disclosed in U.S. Pat. No. 4,230,792.

In the above mentioned patents various supports have been disclosed. With increase in printability, plastic films have been used as a support considering elongation of plate or penetration of water thereinto during printing and a polyester film has been mainly used because of its superior mechanical properties, dimension stability, heat resistance, chemical resistance and transparency.

However, as well known, polyester films are generally high in crystallinity and chemically inert and high in chemical resistance. Besides, since it is not hydrophilic and is highly hydrophobic, further various improvements have been attempted in order to obtain good adhesion to the hydrophilic photographic layers.

For example, there have been proposed such methods as subjecting a polyester film to surface treatments such as chemical treatment, mechanical treatment, discharge treatment, flame treatment, ultraviolet ray treatment, high-frequency treatment, plasma treatment, laser treatment, mixed acid treatment and osonic acid treatment and then directly coating photographic layers thereon. (cf. U.S. Pat. Nos. 2,943,937 and 3,475,193 and British Pat. No. 1,215,234). However, these surface treated polyester films are enhanced in adhesion to hydrophilic layers, but sufficient adhesion strength cannot be obtained.

Further method has been proposed according to which an organic copolymer composition layer is provided on films after surface treatment in order to increase adhesion to hydrophilic photographic layer, namely, so-called subbing layer coating method.

This method can be classified to the following two methods:

(1) A method comprising coating a composition composed of an organic copolymer and an organic solvent which is a swelling agent or dissolving agent for polyester films (referred to as "solvent subbing method" hereinafter). (cf. U.S. Pat. Nos. 2,830,030 and 4,093,458 and British Patent Nos. 772,600, 776,157 and 785,789).

(2) A method comprising coating an aqueous composition (so-called latex) of an organic copolymer containing substantially no organic solvent (referred to as "aqueous composition subbing method"), namely, swelling agent or dissolving agent for hydrophobic support such as polyester is not used and there are used copolymers of, for example, vinyl chloride, vinylidene chloride, methacrylic acid, acrylic acid, itaconic acid, maleic anhydride, styrene and butadiene which are disclosed in U.S. Pat. Nos. 4,128,426, 4,241,169, 4,265,946 and 4,394,442.

The solvent subbing method (1) is being switched to the aqueous composition subbing method (2) due to deterioration of polyester film caused during subbing process or the problem in safety and environmental pollution caused by gas of the organic solvent.

However, it has been found that both of the methods have severe defects in that when as a result of improvement in printability, number of prints must be increased or when a special ink such as ultraviolet ray curing ink is used, the photographic layer peels off from support (so-called "peeling of layer") before the problem of wearing-off of metallic silver or problem in water retention become significant, although there are no problems when the subbed film is used for general photography or when used as a support for lithographic printing plate disclosed in U.S. Pat. No. 3,728,114 or when many prints are not printed.

This phenomenon of peeling of layer is considered to be caused by organic solvent in printing ink and there have been not yet found subbing methods which bring about no peeling of layer, although the phenomenon depends somewhat on the kind of organic copolymer used for subbing layer or subbing method. This is an important problem for lithographic printing plates (especially for those which are used for printing of a large number of prints) which use a polyester film as a support and utilize DTR process.

SUMMARY OF THE INVENTION

Accordingly, the object of the present invention is to provide a light sensitive material for making lithographic printing plates by DTR process which brings about no peeling of layer during printing of a large number of prints or printing with a special ink even when a polyester film subbed with an organic copolymer composition is used as a support of the material.

DESCRIPTION OF THE INVENTION

The above object has been attained by providing a light sensitive material for making lithographic printing plates by DTR process which comprises a support comprising a polyester film subbed with an organic copolymer for imparting adhesion to hydrophilic photographic layer and at least one undercoat layer, a light sensitive silver halide emulsion layer and an image receiving layer containing physical development nuclei coated, in succession, on said support, characterized in that an undermost layer (undercoat layer) contiguous to the support contains a polyfunctional epoxy compound having at least three epoxy groups in molecule.

It is well known to incorporate an epoxy compound in photographic layers of ordinary light sensitive materials, but this is generally used as a hardener and this purpose can be attained by use of epoxy compounds having at least two epoxy groups in molecule. On the other hand, it has not been expected from the technique of using it as hardener that polyfunctional epoxy compounds having at least three epoxy groups in molecule have the effect to prevent peeling of layer caused by organic solvent in printing ink during printing.

It has been also known to contain a compound having epoxy group in molecule as one kind of organic copolymer or together with organic copolymer in a subbing layer on polyester film for hydrophilization and imparting adhesion. However, when hydrophilic photographic layers containing no said polyfunctional epoxy compound are coated on said polyester film, adhesion can be somewhat improved than when compound having epoxy group in molecule is not used in the subbing layer, but this adhesion is not sufficient as compared with the adhesion attained by the present invention and peeling of layer occurs during printing of a large number of prints. On the other hand, when a hydrophilic photographic layer containing said polyfunctional epoxy compound is coated on said subbed polyester film, sufficient adhesion can be obtained and peeling of layer does not occur.

The mechanism by which the polyfunctional epoxy compound contained in hydrophilic photographic layer exhibit the above effect is not clear, but this is an effect unexpectable from conventional knowledge.

Therefore, one object of the present invention is to provide a lithographic printing plate which has sufficient adhesion between the support and photographic layers provided thereon and in which no peeling of layers occur during printing of a large number of prints or printing with a special ink and which is made from a light sensitive material comprising a polyester film made hydrophilic by coating with an organic copolymer composition as a support and an undercoat layer, a light sensitive silver halide emulsion layer and an image receiving layer containing physical development nuclei provided, in succession, on said support.

The supports having a hydrophilic subbing layer of an organic copolymer compound used in the present invention are polyester film supports made hydrophilic with organic copolymer compounds, for example, as described in the above mentioned patent specifications, namely, U.S. Pat. Nos. 2,830,030 and 4,093,458 and British Pat. Nos. 772,600, 776,157 and 785,789 and U.S. Pat. Nos. 4,128,426, 4,241,169, 4,265,946 and 4,394,442, which are incorporated herein by reference.

As the polyfunctional epoxy compounds containing at least three epoxy groups in molecule used in the present invention, there may be used those which have at least three epoxy groups in molecule which are synthesized by known processes. Nonlimiting examples of these polyfunctional epoxy compounds are glycerol polyglycidyl ether, trimethylolpropane polyglycidyl ether, diglycerol polyglycidyl ether, polyglycerol polyglycidyl ether and sorbitol polyglycidyl ether.

The undercoat layer contiguous to the support is an undercoat layer containing gelatin as a hydrophilic high molecular substance as disclosed in U.S. Pat. No. 4,160,670 and amount of the polyfunctional epoxy compound contained in this undercoat layer is preferably 1–150 mg per 1 g of the gelatin contained in the undercoat layer. When the content is less than 1 mg, it is difficult to obtain sufficient adhesion and content of more than 150 mg is not preferred from the point of coating properties and printability. As gelatin used as hydrophilic high molecular substance in the undercoat layer, various gelatins may be used and furthermore, a part of the gelatin may be substituted with hydrophilic colloid, sodium alginate, PVA, PVP or the like. The undercoat layer may also serve as an antihalation layer and furthermore, may contain various surfactants, hardeners, matting agents and additives which are ordinarily used in this field.

As light sensitive silver halide emulsion layer, there may be used any of those which are known in this field.

Further, any physical development nuclei layers may be used such as, for example, those disclosed in U.S. Pat. No. 3,728,114.

Generally, the light sensitive material for making lithographic printing plate of the present invention is imagewise exposed and treated with an alkali developer and, if necessary, is further subjected to treatments for plate making and printing such as with neutralizing solution, fixing solution, etch solution and damping solution. As the developer, there may be used any developers such as, for example, ordinary photographic alkali developers containing developing agent such as hydroquinone and so-called alkaline activating developer containing substantially no developing agent (developing agent being contained in the light sensitive material). These developers may contain other compounds for respective purposes.

Compositions and the like of the neutralyzing solution, fixing solution, etch solution and damping solution may be any of those known for one skilled in the art and various solutions may be used depending on purposes and kind of plate materials.

The following nonlimiting examples illustrate the present invention.

EXAMPLE 1

On a polyester film support subjected to solvent subbing treatment for making hydrophilic in accordance with U.S. Pat. No. 4,093,458 was coated an undercoat layer of the following composition which also served as an antihalation layer.

| <Undercoat layer> | |
|---|---|
| Gelatin | 30 g |
| Matting agent | 10 g |
| Formalin (12% aqueous solution) | 5 cc |
| Carbon black dispersion (solid content 32%) | 5 cc |
| Saponin (10% aqueous solution) | 10 cc |
| Water to make up totally 600 g | |

Coating amount was 45 g/m$^2$ (wet weight).

To the above undercoat layer were added the following polyfunctional epoxy compounds for making various samples.

| No epoxy compound | Comparative sample 1 |
|---|---|
| 1,6-Hexanediol diglycidyl ether (10% methanolic solution) 4.5 cc | Comparative sample 2 |
| Polyglycerolpolyglycidyl ether (10% methanolic solution) 4.5 cc | Sample of the present invention |

On the undercoat layer was coated an orthochromatically sensitized high contrast silver chloride emulsion at a coverage of 1.5 g/m² in terms of silver nitrate.

The emulsion layer contained formaldehyde as a hardener. After drying, each of the emulsion coated supports was warmed at 40° C. for 3 days and then thereon was coated a physical development nuclei layer as described in Example I of U.S. Pat. No. 4,297,429. Then, each of thus obtained samples was subjected to imagewise exposure, thereafter to development and neutralization in accordance with the procedure disclosed in the above patent publication and then drying to obtain a printing plate. The resulting printing plate was mounted on a printing machine, A.B.DICK 350CD (trademark for an offset printing machine manufactured by A.B.Dick Co.) and printing was carried out with the etch solution and damping solution as described in U.S. Pat. No. 4,297,429 and ordinary sumi ink (Indian ink) and degree of peeling of layer was evaluated after printing of a certain number of prints according to the following criteria.

"0": No peeling of layer occurred.
"Δ": Peeling of layer partially occurred.
"X": Peeling of layer occurred on the whole surface.

| | Results | | |
|---|---|---|---|
| Number of prints | 10000 | 20000 | 30000 |
| Comparative sample 1 | 0 | Δ | X |
| Comparative sample 2 | 0 | 0~Δ | X~Δ |
| Sample of the present invention | 0 | 0 | 0 |

As can be seen from the above results, peeling of layer did not occur in the printing plate of the present invention which contained the polyfunctional epoxy compound while peeling of layer occurred in the printing plate containing no polyfunctional epoxy compound and the printing plate containing epoxy compound having two epoxy groups in molecule after printing of a large number of prints.

EXAMPLE 2

A polyester film was subjected to aqueous composition subbing treatment with a subbing composition containing an epoxy compound as described in Japanese Patent Unexamined Publication (Kokai) No. 213942/85 (U.S. Ser. No. 654,545) for rendering the film hydrophilic. On this polyester film support was coated the undercoating composition as prepared in Example 1 with addition of the following compound.

| No epoxy compound | Comparative sample 1 |
|---|---|
| 1,6-Hexanediol diglycidyl ether | |
| | Comparative sample 2 |
| (10% methanolic solution) 4.5 cc | |
| Sorbitol polyglycidyl ether | Sample of the present |
| (10% methanolic solution) 4.5 cc | invention |

Thereafter, in the same manner as in Example 1, printing plates were prepared from them and printing was carried out.

As printing ink, the same ordinary sumi ink as used in Example 1 and ultraviolet curing ink as a special ink were used.

Evaluation of degree of peeling of layer was conducted in the same manner as in Example 1.

| Results 1 Ordinary sumi ink | | | |
|---|---|---|---|
| Number of prints | 10000 | 20000 | 30000 |
| Comparative sample 1 | 0 | 0~Δ | Δ |
| Comparative sample 2 | 0 | 0 | Δ |
| Sample of the present invention | 0 | 0 | 0 |

Results 2 Ultraviolet ray curing ink

| Results 2 Ultraviolet ray curing ink | | | | |
|---|---|---|---|---|
| Number of prints | 5000 | 10000 | 15000 | 20000 |
| Comparative sample 1 | 0 | Δ | X | X |
| Comparative sample 2 | 0 | 0 | Δ | X |
| Sample of the present invention | 0 | 0 | 0 | 0 |

As is clear from the above results, no peeling of layer occurred in the printing plate of the present invention containing the polyfunctional epoxy compound in both of the printing with ordinary sumi ink and printing with ultraviolet ray curing ink. On the other hand, considerable peeling of layer occurred in the printing plate containing epoxy compound only in the subbing layer (Comparative sample 1) and printing plate containing an epoxy compound containing two epoxy groups in molecule (Comparative sample 2).

As is clear from the results of Examples 1 and 2, when a polyester film subjected to subbing treatment by coating an organic copolymer for hydrophilization is used as a support for printing plates, peeling of layer occurs in conventional printing plates after printing of a large number of prints or when a special ink is used for printing while no peeling of layer occurs when a polyfunctional epoxy compound having at least three epoxy groups is contained in an undercoat layer contiguous to the support as in the present invention.

What is claimed is:

1. A light sensitive material for making a lithographic printing plate therefrom by utilizing a silver complex diffusion process which comprises a polyester film made hydrophilic by coating with an organic copolymer as a support and at least one undercoat layer, a silver halide emulsion layer and an image receiving layer containing as physical development nuclei layer provided on said support in succession,
   wherein an undermost layer contiguous to the support contains a polyfunctional epoxy compound having at least three epoxy groups in molecule and a gelatin.

2. A light sensitive material according to claim 1 wherein amount of the polyfunctional epoxy compound contained in the undermost layer is 1–150 mg per 1 g of gelatin contained in the undermost layer.

3. A light sensitive material according to claim 1 wherein the polyfunctional epoxy compound is a polyglycidyl ether.

4. A method for making a lithographic printing plate which comprises subjecting the light sensitive material of claim 1 to imagewise exposure and development with an alkali developer in the presence of a silver halide solvent.

5. A lithographic printing plate made by the method of claim 4, wherein said lithographic printing plate comprises the support, the undermost layer, the undercoat layer, the silver halide emulsion layer, and the image receiving layer containing the physical development nuclei layer.

6. A method of printing which comprises mounting the lithographic printing plate of claim 5 on an offset printing machine and carrying out printing with application of a printing ink.

* * * * *